United States Patent
Hu et al.

(10) Patent No.: US 9,799,823 B1
(45) Date of Patent: Oct. 24, 2017

(54) HIGH TEMPERATURE ENDURABLE MTJ STACK

(71) Applicants: International Business Machines Corporation, Amonk, NY (US); Samsung Electronics Co., Ltd., Suwon-si, Gyeonggi-do (KR)

(72) Inventors: Guohan Hu, Yorktown Heights, NY (US); Kwangseok Kim, Seoul (KR); Younghyun Kim, Seoul (KR); Junghyuk Lee, Seoul (KR); Luqiao Liu, Brookline, MA (US); Jeong-Heon Park, Seoul (KR)

(73) Assignees: INTERNATIONAL BUSINESS MACHINES CORPORATION, Armonk, NY (US); SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/094,059

(22) Filed: Apr. 8, 2016

(51) Int. Cl.
*H01L 43/10* (2006.01)
*H01L 43/02* (2006.01)
*H01L 43/08* (2006.01)
*H01L 43/12* (2006.01)

(52) U.S. Cl.
CPC ............ *H01L 43/02* (2013.01); *H01L 43/08* (2013.01); *H01L 43/10* (2013.01); *H01L 43/12* (2013.01)

(58) Field of Classification Search
CPC ....... H01L 43/08; H01L 27/228; H01L 43/02; H01L 43/10; H01L 43/12

USPC ........................................................ 257/421
See application file for complete search history.

(56) References Cited

U.S. PATENT DOCUMENTS

| | | |
|---|---|---|
| 7,663,197 B2 | 2/2010 | Nagase et al. |
| 8,259,420 B2 | 9/2012 | Zhao et al. |
| 8,508,006 B2 | 8/2013 | Jan et al. |
| 8,760,154 B2 | 6/2014 | Giddings et al. |
| 9,015,927 B2 | 4/2015 | Abraham et al. |
| 2012/0313191 A1* | 12/2012 | Whig ................ H01L 43/08 257/421 |
| 2014/0306302 A1 | 10/2014 | Jan et al. |
| 2015/0263266 A1 | 9/2015 | Gottwald et al. |
| 2016/0190434 A1* | 6/2016 | Hu .................... G11C 11/161 257/421 |

OTHER PUBLICATIONS

Colis, S., et al.; "Magnetic, Transport, and Structural Properties of Fe/Co/Cu/[Co/Ir/Co] Sandwiches and Fe/Co/Cu/[Co/Ir] Multilayers Prepared by Ion-Beam Sputtering"; The American Physical Society; Physical Review B; vol. 62, No. 17; p. 709-718; 2000.

(Continued)

*Primary Examiner* — Monica D Harrison
(74) *Attorney, Agent, or Firm* — Cantor Colburn LLP; Vazken Alexanian

(57) ABSTRACT

Techniques relate to forming a magnetic tunnel junction (MTJ). A magnetic reference layer is formed adjacent to a tunnel barrier layer. The magnetic reference layer includes a pinned layer, a spacer layer adjacent to the pinned layer, and a polarizing enhancement layer adjacent to the spacer layer. A magnetic free layer is formed adjacent to the tunnel barrier layer so as to be opposite the magnetic reference layer.

10 Claims, 6 Drawing Sheets

(56) References Cited

OTHER PUBLICATIONS

Hu, G. et al.; "Spin Torque MRAM Based On Co, Ir Synthetic Antiferromagnetic Multilayer"; U.S. Appl. No. 14/561,690, filed Dec. 5, 2014.

Kim, Jae-Hong, et al.; "Ultrathin W Space Layer-Enabled Thermal Stability Enhancement in A Perpendicular MgO/CoFeB/W/CoFeB/MgO Recording Frame"; Scientific Reports; p. 1-7; Nov. 20, 2015.

Worledge, D.C., et al.; "Spin Torque Switching of Perpendicular Ta/CoFeB/MgO-based Magnetic Tunnel Junctions"; Applied Physics Letters; vol. 98; p. 022501-1-022501-3; 2011.

* cited by examiner

HIGH TEMPERATURE ENDURABLE MTJ STACK

BACKGROUND

The present invention relates generally to semiconductors, and more specifically, to a high temperature endurable magnetic tunnel junction (MTJ) stack which may be utilized in spin torque transfer (STT) magnetic random access memory.

Magnetic random access memory (MRAM) is a nonvolatile computer memory (NVRAM) technology. Unlike conventional RAM chip technologies, in MRAM data is not stored as electric charge or current flows, but by magnetic storage elements. The elements are formed using two ferromagnetic plates, separated by a thin insulating layer. One of the two plates is a permanent magnet set to a particular polarity; the other's magnetic field can be changed. This configuration is known as a spin valve and is the simplest structure for a MRAM bit. A memory device is built from a grid of such "cells".

A typical method of reading is accomplished by measuring the electrical resistance of the cell. A particular cell is (typically) selected by turning on an associated access transistor which passes current from a supply line through the cell to ground. Due to the magnetic tunnel effect, the electrical resistance of the cell changes with the relative orientation of the fields between the two plates. By measuring the resulting current, the resistance associated with any particular cell can be determined, and from this the magnetic orientation of the writable plate (i.e., free layer). Typically if the two plates have the same orientation the cell is considered to hold a value of "0", while if the two plates are of opposite orientation the resistance will be higher and will hold a value of "1".

SUMMARY

According to one or more embodiments, a method of forming a magnetic tunnel junction (MTJ) is provided. The method includes forming a magnetic reference layer adjacent to a tunnel barrier layer. The magnetic reference layer includes a pinned layer, a spacer layer adjacent to the pinned layer, and a polarizing enhancement layer adjacent to the spacer layer. Also, the method includes forming a magnetic free layer adjacent to the tunnel barrier layer so as to be opposite the magnetic reference layer.

According to one or more embodiments, a semiconductor device includes a magnetic reference layer adjacent to a tunnel barrier layer. The magnetic reference layer includes a pinned layer, a spacer layer adjacent to the pinned layer, and a polarizing enhancement layer adjacent to the spacer layer. Also, the semiconductor device includes a magnetic free layer adjacent to the tunnel barrier layer so as to be opposite the magnetic reference layer. A sandwich of the magnetic free layer, the tunnel barrier layer, and the magnetic reference layer together form a magnetic tunnel junction (MTJ).

DETAILED DESCRIPTION

Figure 1:
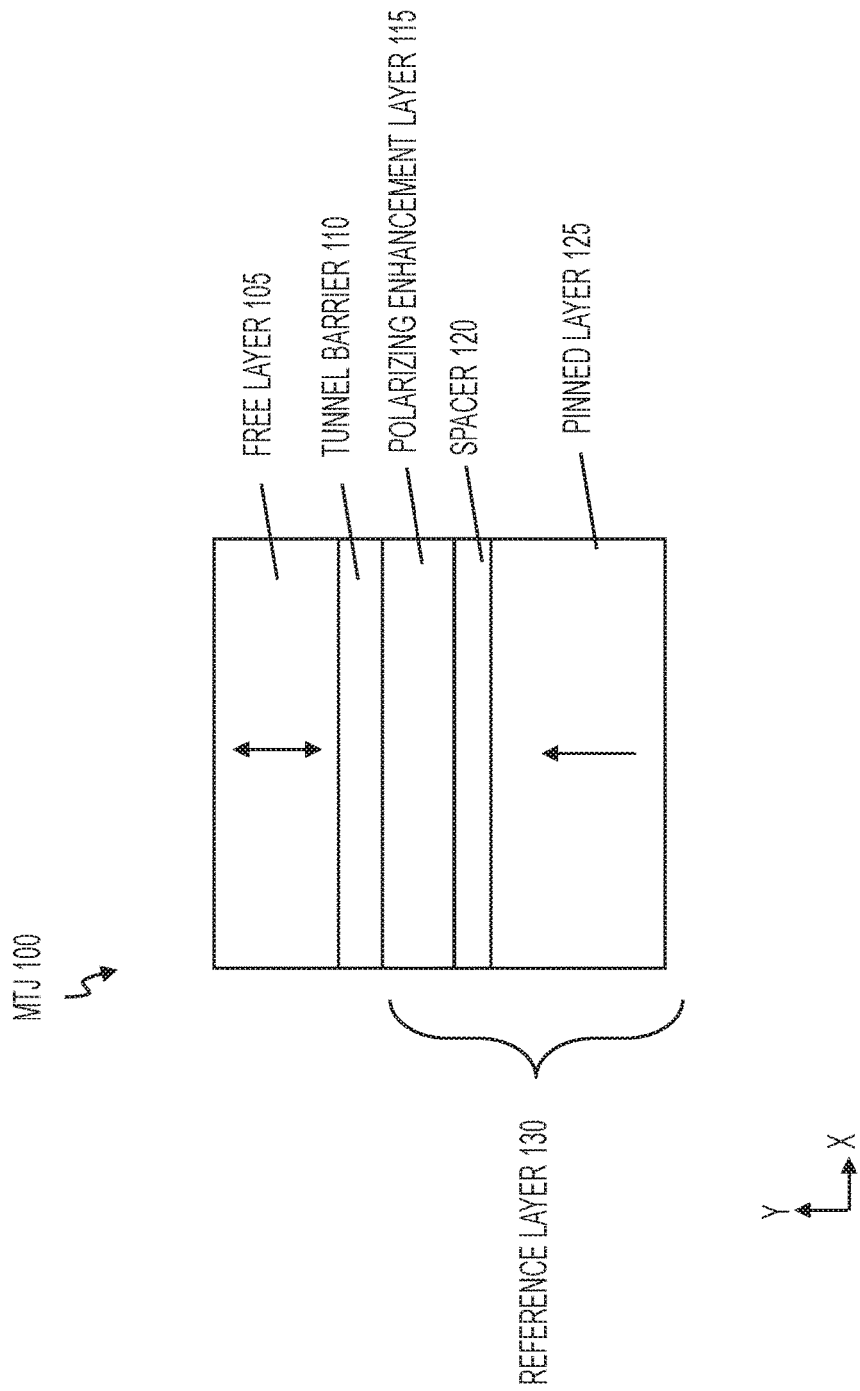
FIG. 1 is a cross-sectional view of a magnetic tunnel junction (MTJ) according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Magnetic random access memory (MRAM) is a nonvolatile solid state memory technology compatible with standard semiconductor manufacturing. Information is stored in the magnetic orientation of a free layer film in relation to that of a reference film. Reading the state of the cell or bit is accomplished by measuring the electrical resistance of a magnetic tunnel junction formed by a sandwich of the free layer, a tunneling barrier, and the reference layer (MTJ stack).

Writing the bit can be achieved in several ways, depending on the technology in use. For field-written MRAM, typical geometries make use of two orthogonal current-carrying wires which are placed in proximity to the magnetic tunnel junction. The current in the wires imposes a magnetic field on the MRAM cell, and with appropriate field amplitude, duration, and relative timing the orientation of the free layer can be written to the desired state. In spin-transfer torque MRAM, external fields are not used in the writing process. Instead, electrical currents passing between the reference layer and the free layer films/plates carry not only a charge current but in addition a spin current. This spin current transferred between the two magnetic films (i.e., the reference layer and the free layer) acts to orient the free layer either parallel or antiparallel to the reference layer, depending on the sign of the electrical current.

One or more embodiments address the problem of thermal stability of perpendicular spin torque MRAM. In particular, it is shown that a new magnetic reference layer is designed and engineered which can maintain its perpendicular anisotropy and high tunneling magnetoresistance (TMR) even after a long time of high temperature annealing. For example, in one implementation, the magnetic reference layer is configured to maintain its perpendicular anisotropy and high tunneling magnetoresistance (TMR) at 400° Celsius (C) for 5 hours (hrs). This makes it possible to integrate with existing processes (of, e.g., building an integrated circuit) where high temperature annealing is necessary. Moreover, the high TMR exhibited after the thermal treatment (i.e., after 400° C. for 5 hours) in this MTJ stack structure makes the MTJ stack ideal for spin torque MRAM applications.

FIG. 1 is a cross-sectional view of a magnetic tunnel junction (MTJ) 100 according to one or more embodiments. The MTJ 100 is a stack of layers. The MTJ 100 includes a magnetic free layer 105. The magnetic free layer 105 is disposed on top of a tunnel barrier 110. The tunnel barrier 110 is disposed on top of a polarizing enhancement layer 115. The polarizing enhancement layer (PEL) 115 is disposed on top of a spacer layer 120. The spacer layer 120 is disposed on top of a magnetic pinned layer 125.

The combination of the polarizing enhancement layer 115, the spacer 120, and the magnetic pinned layer 125 forms a magnetic reference layer 130. Although FIG. 1 depicts the tunnel barrier 110 on top of the magnetic reference layer 130 and the magnetic free layer 105 on top of the tunnel barrier 110, the inverse configuration may be utilized as well. For example, it is contemplated that the magnetic reference layer 130 may be disposed on top of the tunnel barrier 110 while the tunnel barrier 110 is on top of the free layer 105 in one implementation.

In an implementation, the high temperature (up to, e.g., 400° C. for 5 hrs) endurable MTJ stack 100 has been realized by using, e.g., CoIr multilayered pinned layer (PL) 125 with a tungsten spacer 120 insertion. As depicted in FIG. 1, the material of the pinned layer 125 may include N multilayers of CoIr, where N may be 1-20. For example, each layer of the pinned layer 125 may be an alloy of Co and Ir such that N layers of the alloy have been formed on top of one another.

In another implementation, the pinned layer 125 may include separate layers of Co and Ir on top of one another, such that there is an alternating configuration of a Co layer and Ir layer for a total of N layers. It should be appreciated that when using separate layers of Co and Ir at least 2 layers are needed such that N may be 1-20. When using the alternating layers of Co and Ir, one layer may include an alloy xCo and the other layer may include an alloy yIr, where x includes one or more materials of Fe, Ni, and/or B and where y includes one or more materials of Ru and/or Pt. The total thickness in the y-axis of the pinned layer 125 may range from about 1 to 20 nanometers (nm).

The spacer layer 120 is inserted between the pinned layer 125 and polarizing enhancement layer 115 to enhance TMR as well as for thermal stability of the magnetic reference layer 130. Material of the spacer layer 120 may include W, Mo, and/or Zr as well as alloys of W, Mo, and/or Zr in any combination. The total thickness in the y-axis of the spacer layer 120 may range from about 0.2 to 1 nm. The spacer layer 120 may increase TMR because it blocks crystallization templated from pinned layer 125. The spacer layer 120 may increase thermal stability by blocking any diffusion from pinned layer 125 or seed layer below.

Example materials of the polarizing enhancement layer 115 may include Co, Fe, CoFe, and/or CoFeB. The polarizing enhancement layer 115 is designed to enhance polarization of the spin torque current by enhancing coherent tunneling through epitaxial PEL 115 (001)/MgO (001). The thickness in the y-axis of the polarizing enhancement layer 115 may range from about 0.5 to 2 nm.

In conventional system, TMR of the state-of-the-art MTJ decreased after 400° C. anneal compared to TMR at 300° C. However, in one or more embodiments, the TMR of the MTJ 100 having the new reference layer 130 increased over 20% after 400° C. anneal compared to TMR of the MTJ 100 at 300° C. This evidences that having the new reference layer 130 in the MTJ 100 improves the TMR even as the annealing temperature increases, e.g., increases from 300° C. to 400° C.

Example materials of the magnetic free layer 105 may include CoFeB, NiFe, and/or any other suitable materials. The total thickness in the y-axis of the magnetic free layer 105 may range from about 0.5 to 3 nm. The tunnel barrier layer 110 may be a thin oxide material. Example materials of the tunnel barrier layer 110 may include AlO, MgO, etc.

Figure 2A:
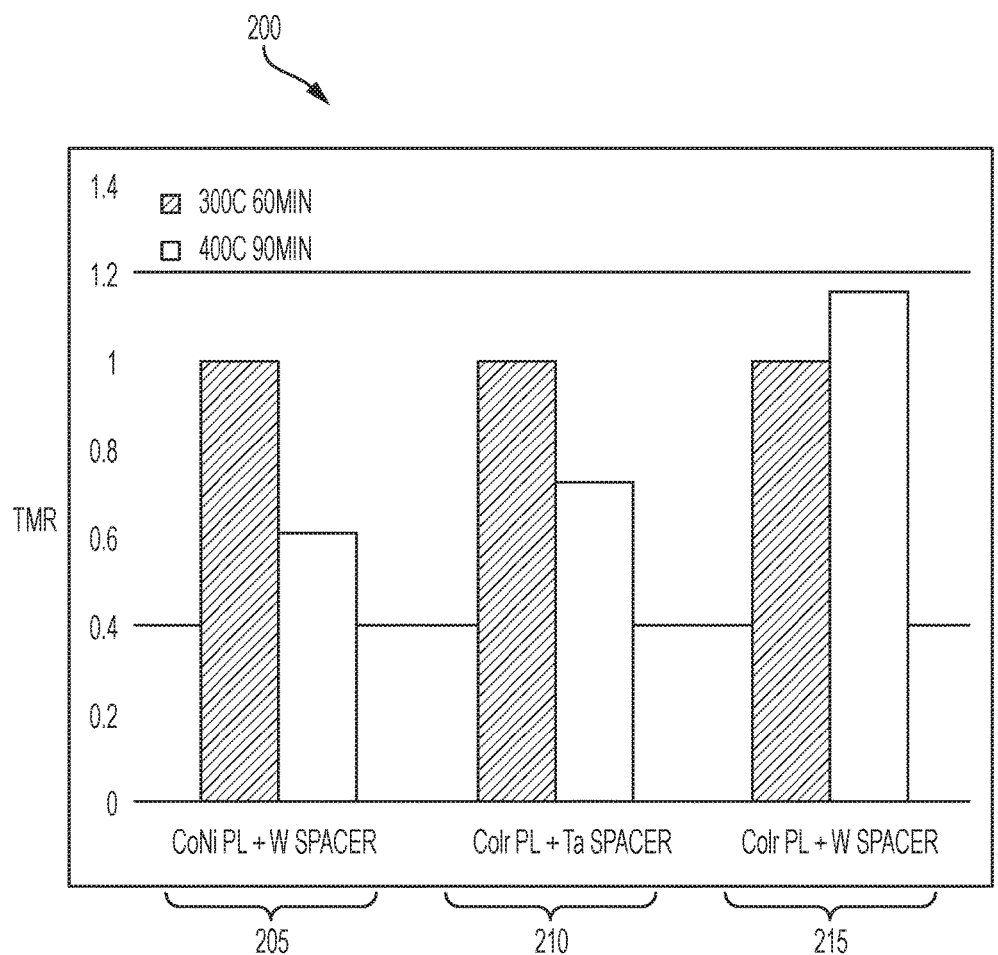
FIG. 2A is a bar graph depicting a normalized tunneling magnetoresistance (TMR) for different annealing temperatures and different MTJ stacks according to one or more embodiments.

FIG. 2A is a bar graph 200 depicting a normalized TMR on the y-axis for two different annealing temperatures and different MTJ 100 stacks according to one or more embodiments.

Figure 2B:
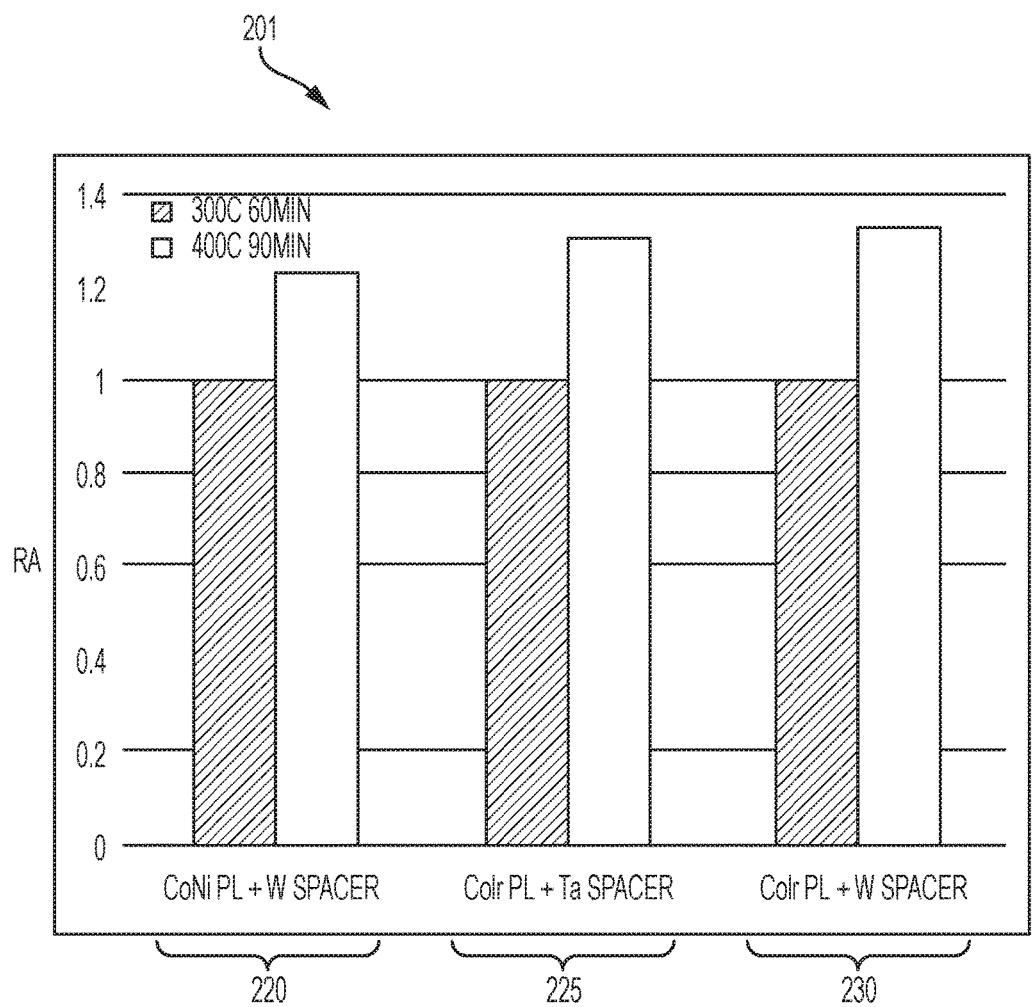
FIG. 2B is a bar graph depicting a normalized resistance area (RA) product for different annealing temperatures and different MTJ stacks according to one or more embodiments.

FIG. 2B is a bar graph 201 depicting a normalized resistance area (RA) product on the x-axis for two different annealing temperatures and different MTJ 100 stack according to one or more embodiments.

The annealing temperatures are 400° C. for 90 minutes (mins) and 300° C. for 60 mins. The MTJ 100 included a multilayered pinned layer 125, spacer layer 120, polarizing layer 115 forming the magnetic reference layer 130, along with tunnel barrier 110 and free layer 105. During the experiments, different materials for the pinned layers 125 and spacer layers were tested.

The tested MTJ 100 stack may include CoNi as the pinned layer 125 and W for the spacer layer 120 as the bar graphs 205 and 220.

As bar graphs 210 and 225, the tested MTJ 100 stack may include CoIr as the pinned layer 125 and Ta as the spacer layer 120.

As bar graphs 215 and 230, the tested MTJ 100 stack may include CoIr as the pinned layer 125 and W as the spacer layer 120. In bar graphs 215, the MTJ 100 has the highest normalized TMR at both 300° C. (60 mins) and 400° C. (90 mins). In bar graphs 230, the MTJ 100 has the highest normalized RA (or at least equal) at both 300° C. (60 mins) and 400° C. (90 mins).

In FIG. 2A, it is shown that the combination of CoIr pinned layer 125 and W spacer layer 120 is the most thermally stable after 400° C. for 90 mins anneal with the enhancement of TMR by approximately 20%.

The normalized CoNi pinned layer 125 with W spacer layer 120 or CoIr pinned layer 125 with Ta spacer layer 120 shows TMR degradation by approximately 35% after 400° C. for 90 mins anneal.

Figure 3:
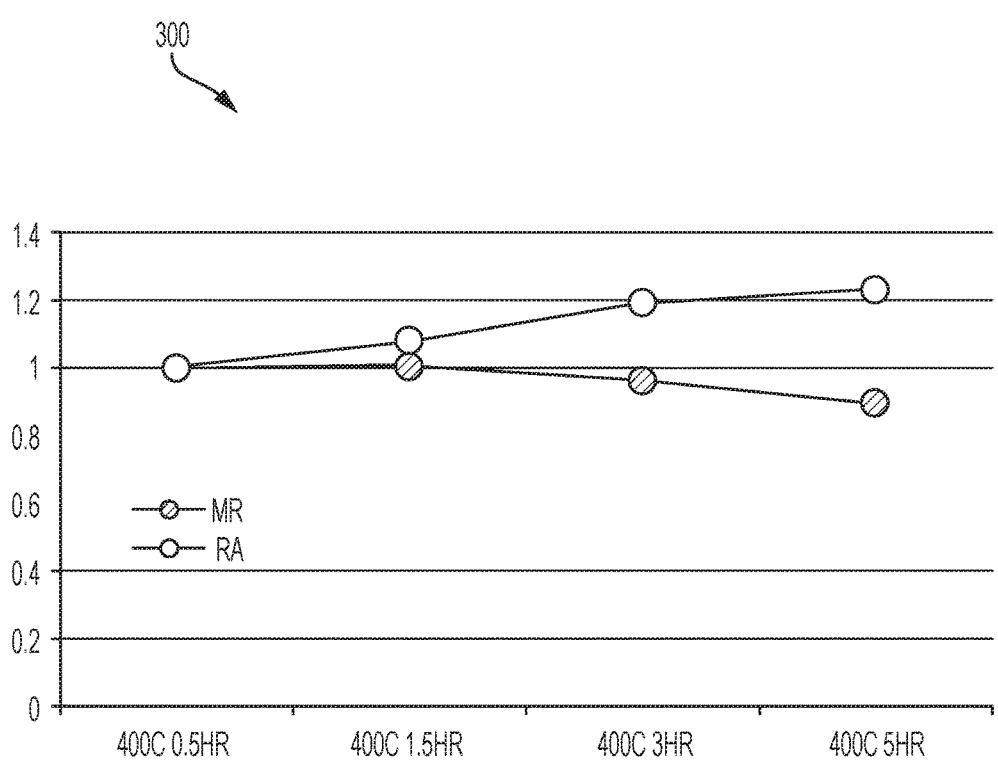
FIG. 3 is a graph depicting a normalized TMR and RA for the MTJ stack along with annealing temperature and time according to one or more embodiments.

FIG. 3 is a graph 300 depicting a normalized TMR and RA on the y-axis for the MTJ 100 stack along with annealing temperature and time on the x-axis according to one or more embodiments.

The MTJ 100 included a multilayered pinned layer 125, spacer layer 120, polarizing layer 115 forming the magnetic reference layer 130, along with tunnel barrier 110 and free layer 105. During the experiments, the MTJ 100 includes the CoIr pinned layer 125 and the W spacer layer 120.

FIG. 3 illustrates superior high temperature stability of CoIr pinned layer 125 with W spacer 120 inserted in the MTJ 100, where TMR has been degraded little even after 400 C for 5 hrs of anneal. Thus, CoIr multilayer pinned layer 125 with W spacer 120 insertion provides secure foundation for mass production of MRAM where large heat processing occurs at the back end of the line (BEOL) process. The heat utilized during the BEOL processing may reach temperatures of approximately (~) 400° C. to 450° C.

Figure 4:
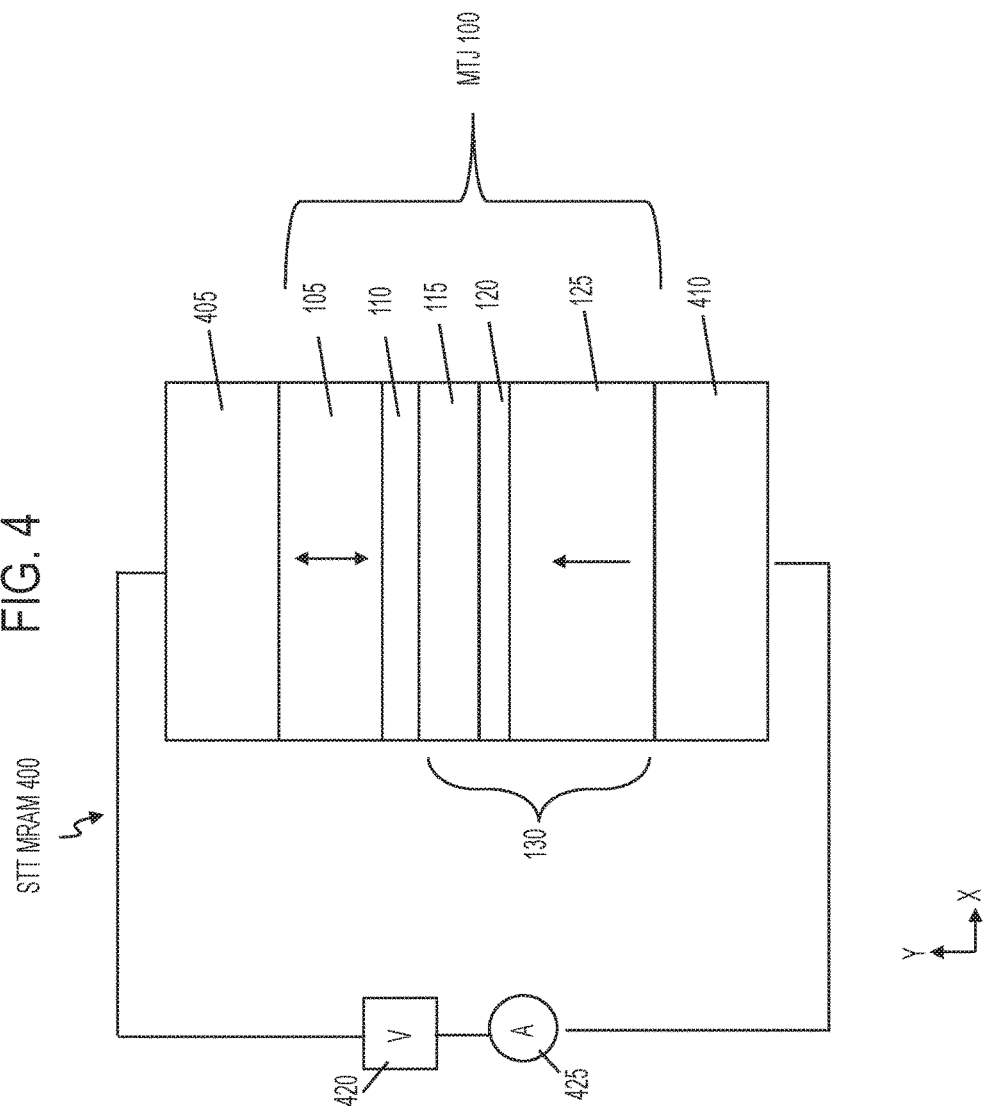
FIG. 4 is a cross-sectional view of a spin torque transfer (STT) magnetic random access memory device (MRAM) according to one or more embodiments.

FIG. 4 is a cross-sectional view of a spin torque transfer magnetic random access memory device 400 according to one or more embodiments. A contact 405 may be formed on top of the MTJ 100. The contact 405 may be a write line.

A contact 410 may be formed on the bottom of the MTJ 100. The contact 410 may be a bit line or a selector line. The contacts 405 and 410 may include conductive materials.

The contacts 405 and 410 connect the MTJ 100 to a voltage source 420 and ammeter 425. The voltage source 420 (or current source) may be utilized to pass write electrical current down through contact 405 into the MTJ 100. The electrical current passing through the MTJ 100 is spin current having an angular momentum to switch the magnetic moment of the magnetic free layer 105 according to the direction of the spin current.

The voltage source 420 may be utilized to pass write electrical current up through contact 410 into the MTJ 100. The electrical current passing up through the MTJ 100 is spin current having an angular momentum to switch the magnetic moment of the magnetic free layer 105 in an opposite direction according to the spin current.

To read the MTJ 100, the voltage source 420 may be utilized to pass a read electrical current through the MTJ 100 to determine the resistance of the free layer 105 relative to the reference layer 130. In one implementation, the resistance of the MTJ 100 is high when the magnetic moments of the free layer 105 and reference layer 130 are antiparallel (i.e., pointing in opposite directions). The resistance of the MTJ 100 is low when the magnetic moments of the free layer 105 and reference layer 130 are parallel (i.e., pointing in the same direction).

Figure 5:
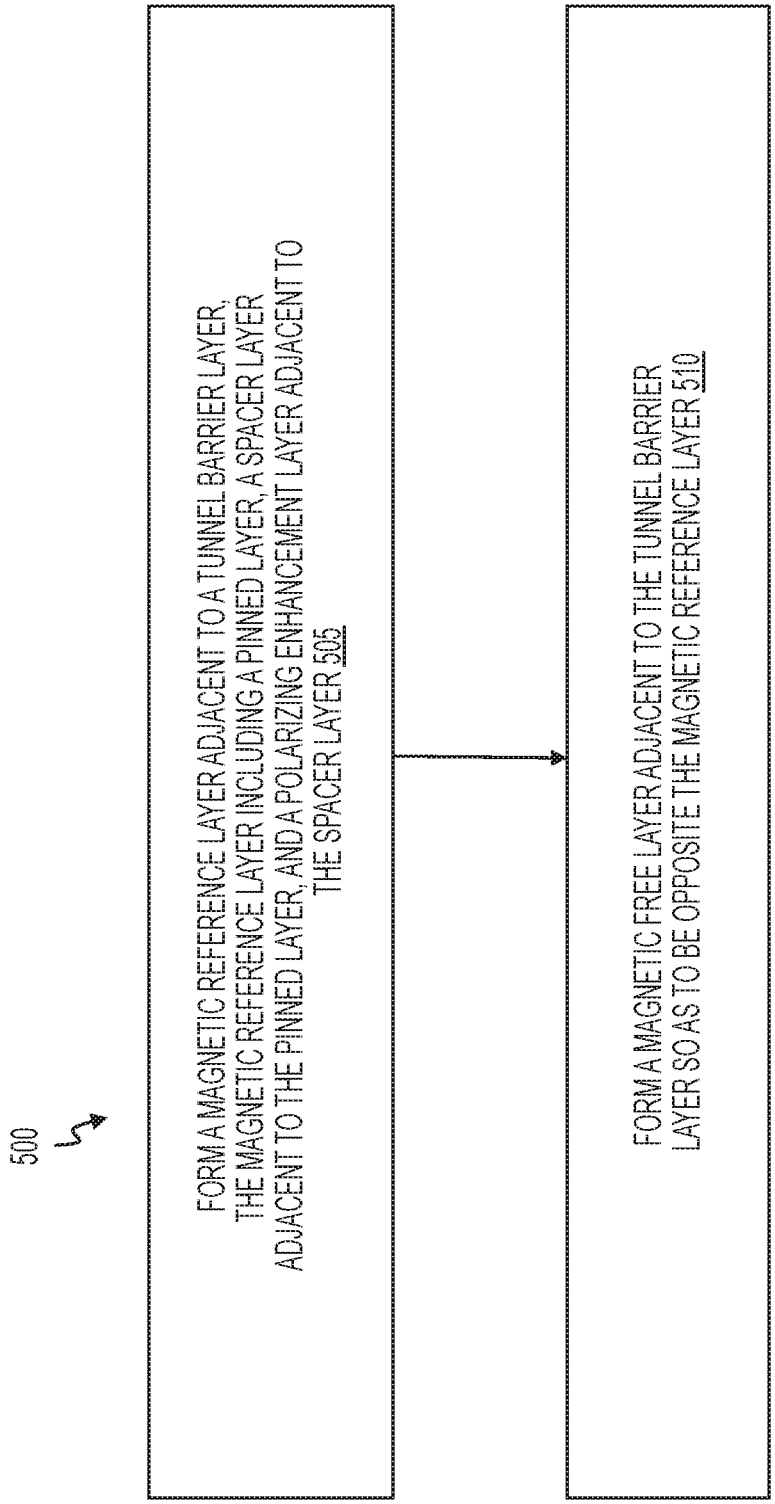
FIG. 5 is a flow chart of a method of forming a magnetic tunnel junction (MTJ) according to one or more embodiments.

FIG. 5 is a flow chart of a method 500 of forming a magnetic tunnel junction (MTJ) 100 according to one or more embodiments. Reference can be made to FIGS. 1-5.

At block 505, a magnetic reference layer 130 is formed adjacent to a tunnel barrier layer 110, where the magnetic reference layer 130 includes a pinned layer 125, a spacer layer 120 adjacent to the pinned layer 125, and a polarizing enhancement layer 115 adjacent to the spacer layer 120. An example is depicted in FIG. 1.

At block 510, a magnetic free layer 105 is formed adjacent to the tunnel barrier layer so as to be opposite the magnetic reference layer 130. An example is depicted in FIG. 1.

The pinned layer 125 is multilayered. The pinned layer 125 is an alloy. The pinned layer includes Co and Ir. The pinned layer includes 1-20 layers of an alloy including Co and Ir.

The spacer layer 120 includes at least one of W, Mo, and Zr. The spacer layer 120 includes an alloy of at least one of W, Mo, and/or Zr.

The magnetic reference layer 130 causes a tunneling magnetoresistance (TMR) in the MTJ 100 to be maintained during annealing. The magnetic reference layer 130 is configured to maintain the TMR for a temperature up to and including 400° Celsius (C). The magnetic reference layer 130 is configured to maintain the TMR for a duration up to and including 5 hours.

The magnetic reference layer 130 causes a resistance area product (RA) to be maintained during annealing. The magnetic reference layer 130 is configured to maintain the RA for a temperature up to and including 400° Celsius (C). The magnetic reference layer 130 is configured to maintain the RA for a duration up to and including 5 hours.

Technical effects and benefits include improved semiconductor devices, such as, e.g., integrated circuits, on a wafer. The improved integrated circuit improves a computer memory. The technical effects further include forming an MTJ stack with a new magnetic reference layer compatible with higher annealing temperatures and extended annealing times.

It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a magnetic tunnel junction (MTJ), the method comprising:
   forming a magnetic reference layer adjacent to a tunnel barrier layer, the magnetic reference layer including a pinned layer, a spacer layer adjacent to the pinned layer, and a polarizing enhancement layer in direct contact with the spacer layer; and
   forming a magnetic free layer adjacent to the tunnel barrier layer so as to be opposite the magnetic reference layer;
   wherein the spacer layer is selected from the group consisting of W, Mo, an alloy including W, an alloy including Mo, and an alloy including W and Mo;

wherein the pinned layer includes alternating layers of Co and Ir.

2. The method of claim 1, wherein the alternating layers are 20 layers.

3. The method of claim 1, wherein the magnetic reference layer causes a tunneling magnetoresistance (TMR) to be maintained during annealing.

4. The method of claim 3, wherein the magnetic reference layer is configured to maintain the TMR for a temperature of about 400° Celsius (C).

5. The method of claim 4, wherein the magnetic reference layer is configured to maintain the TMR for a duration of 5 hours.

6. The method of claim 3, wherein the magnetic reference layer causes a resistance area (RA) product to be maintained during the annealing.

7. The method of claim 6, wherein the magnetic reference layer is configured to maintain the RA for a temperature of about 400° Celsius (C).

8. The method of claim 7, wherein the magnetic reference layer is configured to maintain the RA for a duration up to and including 5 hours.

9. A semiconductor device comprising:

a magnetic reference layer adjacent to a tunnel barrier layer, the magnetic reference layer including a pinned layer, a spacer layer adjacent to the pinned layer, and a polarizing enhancement layer in direct contact with the spacer layer; and a magnetic free layer adjacent to the tunnel barrier layer so as to be opposite the magnetic reference layer;

wherein a sandwich of the magnetic free layer, the tunnel barrier layer, and the magnetic reference layer together form a magnetic tunnel junction (MTJ);

wherein the spacer layer is selected from the group consisting of W, Mo, an alloy including W, an alloy including Mo, and an alloy including W and Mo;

wherein the pinned layer includes alternating layers of Co and Ir.

10. The semiconductor device of claim 9, wherein the alternating layers are 20 layers.

* * * * *